(12) United States Patent
Naylor et al.

(10) Patent No.: US 11,276,644 B2
(45) Date of Patent: Mar. 15, 2022

(54) INTEGRATED CIRCUITS AND METHODS FOR FORMING THIN FILM CRYSTAL LAYERS

(71) Applicant: Intel Corporation, Santa Clara, CA (US)

(72) Inventors: Carl Naylor, Hillsboro, OR (US); Ashish Agrawal, Hillsboro, OR (US); Kevin Lin, Beaverton, OR (US); Abhishek Sharma, Hillsboro, OR (US); Mauro Kobrinsky, Portland, OR (US); Christopher Jezewski, Portland, OR (US); Urusa Alaan, Hilsboro, OR (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 16/221,798

(22) Filed: Dec. 17, 2018

(65) Prior Publication Data
US 2020/0194376 A1    Jun. 18, 2020

(51) Int. Cl.
| | |
|---|---|
| *H01L 23/532* | (2006.01) |
| *H01L 29/45* | (2006.01) |
| *H01L 29/786* | (2006.01) |
| *H01L 23/522* | (2006.01) |
| *H01L 21/768* | (2006.01) |
| *H01L 29/66* | (2006.01) |
| *H01L 21/02* | (2006.01) |

(Continued)

(52) U.S. Cl.
CPC .. *H01L 23/53238* (2013.01); *H01L 21/02568* (2013.01); *H01L 21/02614* (2013.01); *H01L 21/76843* (2013.01); *H01L 21/76867* (2013.01); *H01L 23/5226* (2013.01); *H01L 29/24* (2013.01); *H01L 29/45* (2013.01); *H01L 29/66969* (2013.01); *H01L 29/786* (2013.01); *H01L 21/28568* (2013.01)

(58) Field of Classification Search
CPC ......... H01L 23/53238; H01L 21/76841; H01L 21/76844; H01L 21/02568; H01L 21/02614; H01L 21/76856; H01L 21/28568; H01L 29/24; H01L 29/45; H01L 29/78681; H01L 29/778; H01L 29/66969
See application file for complete search history.

(56) References Cited

U.S. PATENT DOCUMENTS

| | | | | |
|---|---|---|---|---|
| 6,352,917 B1 * | 3/2002 | Gupta | ............... | H01L 21/76831 438/622 |
| 7,344,936 B2 * | 3/2008 | Schulze | .............. | H01L 21/6835 438/209 |

(Continued)

*Primary Examiner* — Michael M Trinh
(74) *Attorney, Agent, or Firm* — 2SPL Patent Attorneys PartG mbB; Kieran O'Leary

(57) ABSTRACT

An aspect of the disclosure relates to an integrated circuit. The integrated circuit includes a first electrically conductive structure, a thin film crystal layer located on the first electrically conductive structure, and a second electrically conductive structure including metal e.g. copper. The second electrically conductive structure is located on the thin film crystal layer. The first electrically conductive structure is electrically connected to the second electrically conductive structure through the thin film crystal layer. The thin film crystal layer may be provided as a copper diffusion barrier.

9 Claims, 10 Drawing Sheets

(51) Int. Cl.
*H01L 29/24* (2006.01)
*H01L 21/285* (2006.01)

(56) References Cited

U.S. PATENT DOCUMENTS

| | | | | |
|---|---|---|---|---|
| 7,371,688 | B2* | 5/2008 | Ji | H01L 21/32136 |
| | | | | 438/710 |
| 9,711,456 | B2* | 7/2017 | Canaperi | H01L 23/53238 |
| 2002/0068488 | A1* | 6/2002 | Tuller | H01L 21/0485 |
| | | | | 439/775 |
| 2013/0077272 | A1* | 3/2013 | Lin | H01L 24/13 |
| | | | | 361/760 |
| 2016/0049542 | A1* | 2/2016 | Agrawal | H01L 21/02568 |
| | | | | 438/95 |
| 2016/0315561 | A1* | 10/2016 | Shin | H02N 1/04 |
| 2017/0033003 | A1* | 2/2017 | Song | H01L 23/53266 |
| 2018/0269291 | A1* | 9/2018 | Lin | H01L 21/02614 |

* cited by examiner

INTEGRATED CIRCUITS AND METHODS FOR FORMING THIN FILM CRYSTAL LAYERS

FIELD

Examples relate to integrated circuits with thin film crystal layers, and to methods for forming thin film crystal layers.

BACKGROUND

The ongoing development of semiconductor technology leading to smaller structures requires new functional and small scaled semiconductor structures, e.g. structures in integrated circuits, as well as improved semiconductor processes.

However, temperature limitations, for example in back end of line processes due to structures of an integrated circuit already formed, may impede integration of required semiconductor structures in integrated circuits. Further, complex semiconductor processes increase a required time for forming integrated circuits and therefore increase manufacturing costs.

BRIEF DESCRIPTION OF THE FIGURES

Some examples of apparatuses and/or methods will be described in the following by way of example only, and with reference to the accompanying FIGS., in which

FIGS. 5a-5d show an example of forming a thin film crystal layer as a copper diffusion barrier;

DETAILED DESCRIPTION

Various examples will now be described more fully with reference to the accompanying drawings in which some examples are illustrated. In the FIGS., the thicknesses of lines, layers and/or regions may be exaggerated for clarity.

Accordingly, while further examples are capable of various modifications and alternative forms, some particular examples thereof are shown in the FIGS. and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the FIGS., which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
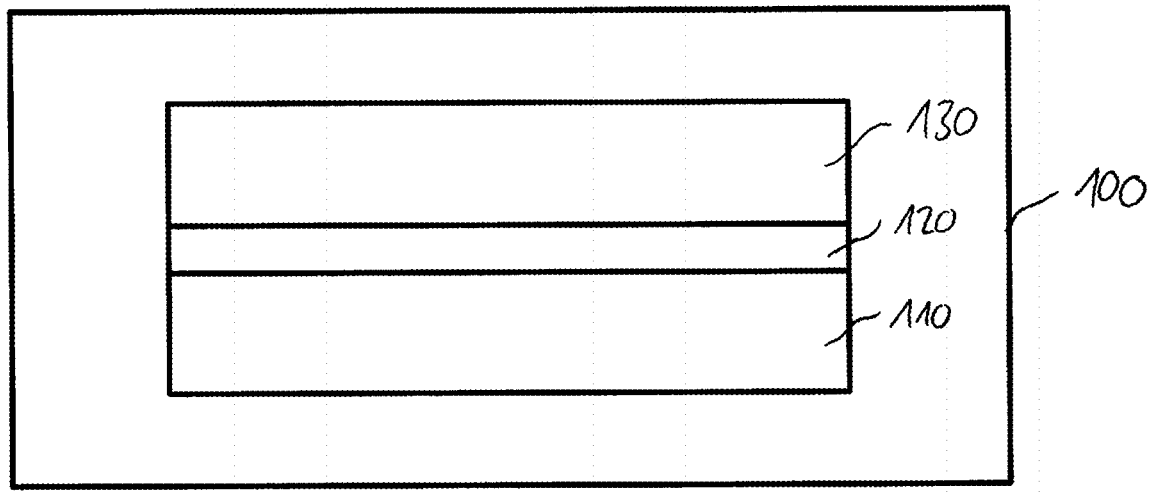
FIG. 1 shows an example of an integrated circuit with an electrically conductive structure.

FIG. 1 shows a schematic cross section of an integrated circuit 100 with an electrically conductive structure. The integrated circuit 100 comprises a first electrically conductive structure 110. The integrated circuit 100 further comprises a thin film crystal layer 120 located on the first electrically conductive structure 110. Further, the integrated circuit 100 comprises a second electrically conductive structure 130. The second electrically conductive structure 130 comprises metal, e.g. copper or aluminum. The second electrically conductive structure 130 is located on the thin film crystal layer 120.

For example, the first electrically conductive structure 110 may be electrically connected to the second electrically conductive structure 130 through the thin film crystal layer 120. The thin film crystal layer 120 may provide an electrical contact between the first electrically conductive structure 110 and the second electrically conductive structure 130.

For example, the second electrically conductive structure 130 may be a copper structure (e.g. a copper layer) or a copper alloy structure having a copper concentration of more than 50% (or more than 70%, more than 90%, or more than 95%), for example.

By contrast, the first electrically conductive structure 110 may be a material free of copper (or with a copper concentration of less than 2%; less than 1% or less than 0.1%), for example. The concentration of copper within the first electrically conductive structure 110 may be less than 20% (or less than 10%, or less than 5%) the copper concentration within the second electrically conductive structure 130, for example. The first electrically conductive structure 110 may be an aluminum structure or an electrically conductive semiconductor structure (e.g. poly-silicon). It may be necessary to avoid diffusion or migration of copper atoms into the first electrically conductive structure, for example to ensure a functionality of the integrated circuit 100. Without providing a metal diffusion barrier (e.g. a copper diffusion barrier), for example, interconnect failures may occur.

The thin film crystal layer 120 may reduce or even prevent diffusion of metal atoms (e.g. copper atoms) at least from the second electrically conductive structure 130 to the first electrically conductive structure 110. Therefore, the thin film crystal layer 120 may be referred to as copper diffusion barrier. By providing the thin film crystal layer 120 between the first electrically conductive structure 110 and the second electrically conductive structure 130, a direct contact of the first electrically conductive structure 110 and the second electrically conductive structure 130 may be avoided, for example. For example, the thin film crystal layer 120 may be further located between the second electrically conductive structure and further structures (e.g. electrically insulating structures) of the integrated circuit 100 to reduce diffusion of copper atoms from the second electrically conductive structure 130 into the further structures.

When using other concepts of copper diffusion barriers, thick layers may be needed to enable sufficient reduction of copper diffusion. However, thick layers may increase an electrical resistance, e.g. a line resistance or a resistance between the first electrically conductive structure 110 and the second electrically conductive structure 130. By contrast, when providing the thin film crystal layer 120 as copper diffusion barrier, thin layers may enable sufficient reduction of copper diffusion. Further, thin layers may avoid increase of electrical resistance, and may for example reduce a line resistance.

Accordingly, for example a thickness of the thin film crystal layer 120 may be smaller than 10 nm (or smaller than 5 nm, smaller than 3 nm or smaller than 2 nm). For example, the thickness may be an average thickness along the thin film crystal layer 120 or a maximum thickness of the thin film crystal layer 120. Providing a thin film crystal layer having a small thickness may enable reducing copper diffusion while keeping an electrical resistance between the first electrically conductive structure 110 and the second electrically conductive structure 130 low.

For example, the thin film crystal layer 120 may comprise a plurality of two-dimensional crystalline monolayers. A two-dimensional crystalline monolayer may be a layer comprising only one atom layer. Alternatively, a two-dimensional crystalline monolayer may be a layer comprising only one molecular layer (e.g. molybdenum disulfide $MoS_2$). For example, the number of the monolayers of the thin film crystal layer 120 may be smaller than 20 (or smaller than 10, smaller than 8, or smaller than 5). A two-dimensional crystalline monolayer may have a thickness of less than 1 nm (or less than 0.8 nm). For example, already one or a few two-dimensional crystalline monolayers may reduce copper diffusion. For example, providing only a few monolayers between two electrically conductive structures may have only an insignificant impact on an electrical resistance between the two electrically conductive structures.

The thin film crystal layer 120 may comprise metal atoms. For example, the thin film crystal layer 120 may comprise at least 10% (or at least 20%) of metal atoms. The metal atoms may be one of Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg. For example, the metal atoms may be transition metal (or transition element) atoms. A transition metal may be any element in the d-block of the periodic table, for example. For example, the metal atoms may be molybdenum.

For example, the thin film crystal layer 120 may further comprise secondary atoms, for example at least 10% of secondary atoms. The secondary atoms may be chalcogens, for example. The secondary atoms may be one of S, Cl, H, O, Se, or Te. For example, the secondary atoms may be S or Te.

Consequently, the thin film crystal layer 120 may be a transition metal dichalcogenide TMD layer. A TMD material may have the formula $ME_2$, where M is a transition metal and E is a chalcogen, e.g. one of S, Se, and Te. For example, the thin film crystal layer 120 may be a $MoS_2$ layer, or a $MoTe_2$ layer.

For example, the thin film crystal layer 120 may further comprise at least 10% of tertiary atoms. For example, also the tertiary atoms may be chalcogens. For example, the tertiary atoms are one of S, Cl, H, O, Se, or Te.

For example, a thin film crystal layer comprising metal atoms, secondary, and tertiary atoms may be a ternary MAX phase layer. For example, MAX phases may refer to layered, hexagonal carbides and nitrides. MAX phases may have the general formula $M_{n+1}AX_n$, (MAX) with n being 1, 2, or 3; M being an early transition metal, for example; A being an A-group (for example IIIA and IVA, or groups 13 and 14) element; and X being either carbon and/or nitrogen, for example. For example, the thin film crystal layer 120 may comprise one of $Ti_2SC$, $Ti_2CdC$, $Hf_2InC$, $Hf_2SSc$, or $Ti_3SiC_2$.

For example, according to methods described below, the thin film crystal layer 120 may be formed at low temperatures, e.g. at temperatures of less than 400° C. Consequently, forming thin film crystal layers may be integrated in numerous semiconductor processes, for example having temperature constraints. Such temperature constraints may occur in back end of line processes, for example if a thin film crystal layer is to be formed on further structures already formed on the integrated circuit 100 (e.g. transistor structures or doped semiconductor regions). Therefore, it is possible to integrate a thin film crystal layer in such portions of the integrated circuit 100.

Accordingly, the thin film crystal layer 120 may be embedded in (or on) a back end of line portion of the integrated circuit 100, for example. The back end of line portion may comprise semiconductor structures requiring temperature limitations of semiconductor processes, for example.

For example, the second electrically conductive structure 130 may be a wiring structure of the integrated circuit 100. The wiring structure may be a via (vertical interconnect access) structure or an electrical line structure, for example. For example, the via may electrically contact an electrical line (e.g. a copper structure) of a first layer of the integrated circuit 100 with an electrical component of a second layer of the integrated circuit 100, the electrical component of the second layer comprising the first electrically conductive structure 110, for example.

For example, the second electrically conductive structure 130 may be electrically connected to at least one of a source region, a drain region, and a gate of a transistor of the integrated circuit. Accordingly, the source region, drain region and/or gate may comprise the first electrically conductive structure 110 being separated from the second electrically conductive structure 130 by the thin film crystal layer 120. The second electrically conductive structure 130 may be a copper structure and diffusion of copper atoms into the source region, the drain region and/or the gate may be avoided by providing the thin film crystal layer 120, for example.

For example, the thin film crystal layer 120 may be located on at least a side wall of the wiring structure. The wiring structure may be a via, for example a vertical structure providing an electrical connection through an electrically insulating layer (e.g. an ILD). For example, it may be necessary to avoid diffusion of copper into the ILD on a least one side of the wiring structure. Further, it may be possible to locate the thin film crystal layer 120 at two side walls or at all side walls of the wiring structure (e.g. at four side walls of the via) to reduce diffusion of copper atoms of the wiring structure in at least two regions adjacent to the wiring structure (e.g. all regions laterally adjacent to the via).

For example, the thin film crystal layer 120 may be located on a bottom surface of the wiring structure. A wiring structure with the thin film crystal layer 120 located on its bottom surface may be an electrical line, for example located on electrically insulating material. The thin film crystal layer 120 may avoid diffusion of copper from the wiring structure into the electrically insulating material, for example. Alternatively, a bottom surface of the wiring structure (e.g. the via) may be free of thin film crystal material, for example if the via leads to a further copper structure of the integrated circuit 100.

According to methods for forming a thin film crystal layer as described below, it may be possible to form thin film crystals by depositing metal on a structure and then transform the deposited metal into thin film crystal. Due to the metal deposition, a contact interface between the thin film crystal and the structure may have a high quality, for example the deposited metal may have a continuous contact with a surface of the structure.

Accordingly, a contact interface between the thin film crystal layer and a structure adjacent to the thin film crystal layer may be voidless, for example. For example, within more than 95% (or more than 97%, or more than 99%) of an overlapping area of the thin film crystal layer 120 and said structure, the thin film crystal layer 120 may have a direct contact to said structure, e.g. a voidless contact. Said structure adjacent to the thin film crystal layer may be an electrically insulating structure, a dielectric structure, or an electrically conductive structure, for example. For example, other concepts including transferring thin film crystal layers onto a further structure may result in voids between the thin film crystal layer and the further structure resulting from the transfer process. For example, transferred thin film crystals may be positioned non-planar on other structures.

The integrated circuit 100 may be a processor, a memory, a transmitter, or a receiver for example. For example, the integrated circuit 100 may be a microprocessor or a central processing unit CPU. For example, the integrated circuit 100 may be an RF device.

The transistor of the integrated circuit 100, e.g. the thin film crystal transistor, may be a field effect transistor, e.g. a MOSFET or a JFET. For example, the transistor of the integrated circuit 100 may be a bipolar transistor.

The semiconductor substrate may be a silicon substrate or a wide band gap substrate, for example. The wide band gap substrate may be a GaN substrate or a GaAs substrate, for example.

For example, the integrated circuit 100 may comprise lateral wiring layers and vertical wiring layers. A lateral wiring layer (e.g. metal layer of a layer stack of an integrated circuit) may be a layer for implementing lateral electrical connections between vertical electrical connections (vias) connecting lateral wiring layers. A vertical wiring layer (e.g. via layer of a layer stack of an integrated circuit) may be a layer for implementing vertical electrical connections (vias) between lateral wiring layers.

Figure 2:
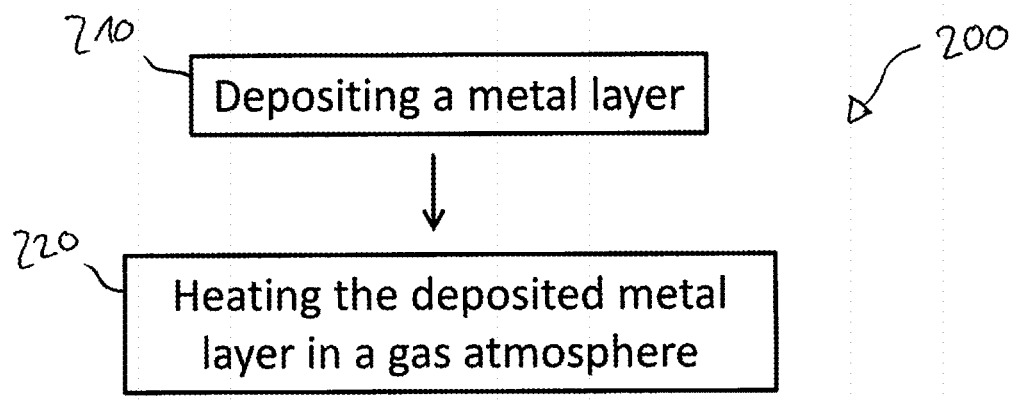
FIG. 2 shows an exemplary flow chart of a method for forming a thin film crystal layer.
Figure 3:
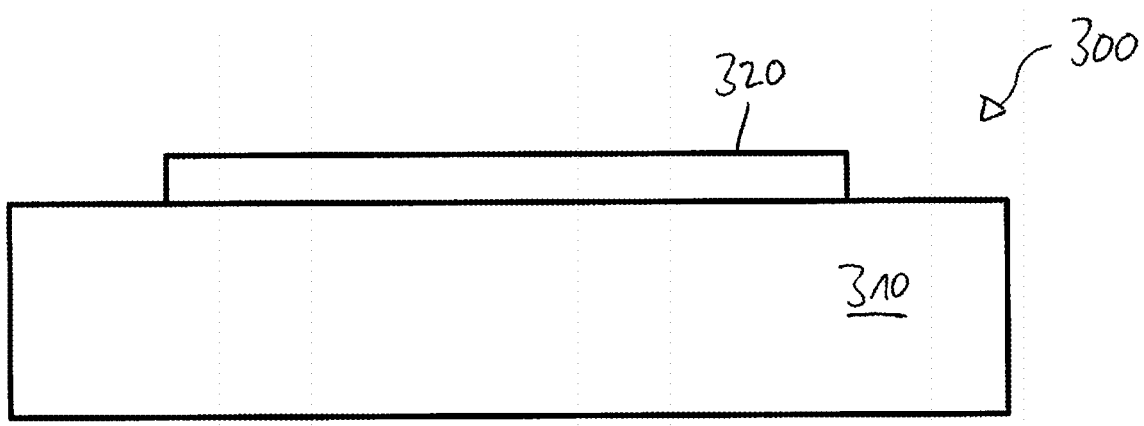
FIG. 3 shows an example of an integrated circuit with a thin film crystal layer.

FIG. 2 shows an exemplary flow chart of a method 200 for forming a thin film crystal layer, e.g. a thin film crystal layer as shown in examples of FIG. 1 and FIG. 3.

The method 200 for forming a thin film crystal layer comprises depositing 210 a metal layer. The metal layer may be deposited 210 on a structure of an integrated circuit, for example (e.g. an electrically insulating structure). The deposited 210 metal layer may have a thickness smaller than 10 nm (or smaller than 5 nm, or smaller than 3 nm), for example.

Further, the method 200 comprises heating 220 the deposited 210 metal layer in a gas atmosphere. Heating 220 in the gas atmosphere may cause a transformation of the metal layer into a thin film crystal layer. The metal layer may be heated 220 after depositing 210 the metal layer, for example.

The method 200 may enable forming the thin film crystal layer at lower temperatures, for example compared to other methods for forming thin film crystals. By forming the thin film crystal in separated steps, e.g. in a first step of metal deposition, and a second step of transforming the metal into a thin film crystal, the method 200 may be performed at temperatures lower than temperatures of other methods comprising direct growth of a thin film crystal from a gas phase, for example. Accordingly, the method 200 may enable integration of forming thin film crystal layer in semiconductor processes having temperature constraints, for example back end of line semiconductor processes.

For example, according to the method 200, the thin film crystal layer may be formed having a plurality of two-dimensional crystalline monolayers. A two-dimensional crystalline monolayer may be a layer comprising only one layer of atoms. Alternatively, a two-dimensional crystalline monolayer may be a layer comprising only one layer of molecules (e.g. molybdenum disulfide $MoS_2$). For example, the number of formed monolayers of the thin film crystal layer may be smaller than 20 (or smaller than 10, smaller than 8, or smaller than 5). A two-dimensional crystalline monolayer may have a thickness of less than 1 nm (or less than 0.8 nm).

For example, the metal layer may be deposited 210 using chemical vapor deposition (CVD). Using CVD may enable depositing 210 the metal layer at temperatures below 400° C. (or below 300° C., or below 250° C.), for example. Using CVD may enable fast deposition 210 of the metal layer. CVD may enable a good control of the metal layer deposition 210, for example the metal layer may be formed having a well-defined and/or uniform thickness.

For example, the forming of the thin film crystal layer may be performed at a maximum temperature of 500° C. (or at a maximum temperature of 400° C., or of 300° C.), for example. For example, within the gas atmosphere, the metal layer may transform into the thin film crystal layer by heating 220 the metal layer up to a maximum temperature of 400° C. The transformation may result from atoms of the gas atmosphere that are incorporated into the metal layer while heating 220 the metal layer. The metal layer may comprise metal accepting atoms from the gas atmosphere at low temperatures. The heating 220 in the gas atmosphere may be performed with a minimum temperature of 200 C, for example.

For example, the deposited 210 metal layer may be heated 220 for at least 10 seconds (or at least 30 sec., at least 1 min., at least 5 min., at least 10 min., at least 1 h, at least 2 h, at least 5 h or at least 10 h) and/or for at most 48 h (or at most 10 h, at most 5 h, at most 1 h, at most 30 min. or at most 10 min).

For example, the deposited 210 metal layer may comprise one of Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg. For example, the metal layer may be a transition metal layer. For example, the metal layer may be formed by depositing 210 molybdenum.

For example, the metal layer is heated 220 in a gas atmosphere comprising one of S, Cl, H, O, Se, or Te. For example, the gas atmosphere may comprise a chalcogen, e.g. S or Te.

Consequently, by heating 220 the metal layer, the metal layer may be transformed into a transition metal dichalcogenide TMD layer. For example, the thin film crystal layer formed according to the method 200 may be a $MoS_2$ layer, or a $MoTe_2$ layer.

Alternatively, the gas atmosphere may comprise two different atom types, for example to transform the deposited 210 metal layer, e.g. comprising a transition metal, into a MAX phase layer. For example, the gas atmosphere may comprise A-group (for example IIIA and IVA, or groups 13 and 14) elements, and carbon or nitrogen atoms, for example. For example, the gas atmosphere used for heating 220 the metal layer may comprise one of $(CH_3)_2S$, $H_2S$, $SO_2$, $(CH_3)_2Te$, $H_2Te$, $TeO_2$, $(CH_3)_2Se$, $H_2Se$, $SeO_2$.

According to an aspect, the method 200 may be used to form a thin film crystal layer comprising at least two different thin film crystals. For example, a first portion of the thin film crystal layer may comprise a first thin film crystal, and a second portion of the thin film crystal layer may comprise a second thin film crystal. The first and second portion may be located adjacent to each other. For example, the method 200 may be used to form heterojunction thin film crystal layers.

According to an example, two different metals may be heated 220 together in a common gas atmosphere (e.g. simultaneously), resulting in a transformation of the metals into two different thin film crystals (see for example also FIGS. 9a to 9g).

For example, the formed metal layer may comprise at least a first material and a second material, different from the first material. The deposited metal layer may be a structured metal layer comprising at least two portions of different material. For example, the first and the second material may be different transition metals. As the type of crystal formed according to the method 200 may depend on the used material of the metal layer, the first material may transform into another thin film crystal than the second material when accepting atoms of the gas atmosphere. Accordingly, the heating 220 in the gas atmosphere may cause the first material of the metal layer to transform into a first thin film crystal, and the second material of the metal layer to transform into a second thin film crystal.

The structured metal layer may be formed by depositing a first metal layer of the first material and forming a mask layer on the first metal layer. The mask layer may cover first portions of the first metal layer. Then, the first metal layer may be etched and a second metal layer of the second material be deposited on the etched structure. The structured metal layer comprising first and second material may be formed by polishing the formed structure back to a top surface of the first portions of the first metal layer, for example. According to the example, a heterojunction thin film crystal layer may be easily formed. For example, due to the mask layer defining the first portions, the dimensions of the portions of different thin film crystals in the heterojunction thin film crystal layer may be easily and exactly defined.

Alternatively, according to an example, a metal layer comprising a metal may be heated 220 in a first gas atmosphere while being covered by a mask layer, and subsequently in a second gas atmosphere while being covered by a further mask layer, so that a first portion of the metal layer exposed to the first gas atmosphere transforms into a first thin film crystal, and a second portion of the metal layer exposed to the second gas atmosphere transforms into a second thin film crystal (see FIGS. 8a to 8f, for example).

For example, heating 220 the deposited metal layer in the gas atmosphere may comprise exposing a first portion of the metal layer to a first gas atmosphere to transform the metal of the first portion into a first thin film crystal layer material. Further, heating 220 may comprise exposing a second portion of the metal layer to a second gas atmosphere to transform the metal of the second portion into a second thin film crystal layer material. The second portion may be geometrically complementary to the first portion, for example. While exposing the first portion to the first gas atmosphere, the second portion may be covered by a mask layer, for example. In a same way, while exposing the second portion to the second gas atmosphere, the first portion may be covered by a further mask layer, for example. For example, a heterojunction thin film crystal layer may be easily formed. The method may enable forming well-defined dimensions of the portions of different thin film crystal, for example.

For example, the thin film crystal layer may be formed in an integrated circuit in a back end of line process. The integrated circuit may comprise at least one semiconductor structure (e.g. a transistor) or a plurality of semiconductor structures before forming the thin film crystal layer. For example, an electrically insulating layer may be located on the semiconductor structure before forming the thin film crystal layer. For example, the metal layer may be deposited 210 on said electrically insulating layer.

Due to forming the thin film crystal layer by depositing 210 the metal layer and heating 220 the metal layer, large thin film crystals may be formed, for example in back end of line processes. For example, the thin film crystal layer may be formed over an area of at least 0.1 $\mu m^2$ (or over at least 0.3 $\mu m^2$, or over at least 0.5 $\mu m^2$) and/or of at most 1 $\mu m^2$. Using proposed concepts for forming thin film crystal layers may enable full coverage of the thin film crystal layer and/or good height control when forming the thin film crystal layer (for example, a plurality of devices may comprise formed thin film crystal layer of a similar height). For example, a thickness of the formed thin film crystal layer may vary from 0.6 nm (monolayer) to 15 nm (few layers) across a wafer. Consequently, due to a voidless contact interface between the thin film crystal layer and a semiconductor structure, a maximum distance from the semiconductor structure to a top surface of the thin film crystal layer may be less than 15 nm, for example. By contrast, when using other methods like exfoliation techniques instead of direct forming of thin film crystals, thin film crystal layers provided in other back end of line processes may show a high variation of their height (e.g. up to 100 nm or more within an area of some $\mu m^2$), for example, due to transferring the thin film crystals, for example (e.g. thin film crystals in a plurality of other devices may each have a different height or thickness).

For example, the method 200 may comprise structuring the metal layer. For example, a further metal layer may be deposited to form a layer of at least two portions of different metals. For example, the method may comprise using or forming spacers to laterally separate the at least two different portions of the layer. The spacers may be formed between portions of different metals. Further, the method may comprise removing the spacers before heating 220 the metal layer in the gas atmosphere. The spacers may be etched, for example. After etching, voids may be located laterally between the portions of different metal. While heating 220 the metal in the gas atmosphere, the at least one of the metals may laterally expand, resulting in closing the voids so that a continuous heterojunction thin film crystal layer may be achieved.

An aspect relates to transferring a formed thin film crystal layer. For example, the metal layer may be deposited on a start substrate. The start substrate may be a silicon substrate, for example free of semiconductor structures (e.g. transistors) causing temperature limitations of semiconductor processes. The method may comprise forming a semiconductor structure (e.g. a semiconductor die comprising transistors) on the thin film crystal layer, and removing the start substrate. Accordingly, the thin film crystal layer may be formed on a substrate that can be processed without temperature limitations, and then be transferred to a semiconductor structure that can only be processed below a maximum temperature, for example.

For example, the metal layer deposited on the start substrate may be heated up to at least 400° C. before forming the semiconductor structure, for example. Transferring the thin film crystal layer from the start substrate to the semiconductor structure may enable forming the thin film crystal layer on the start substrate without temperature restrictions. For example, the thin film crystal layer may be directly grown on the start substrate from a gas phase at high temperatures, and subsequently be transferred to the semiconductor substrate having temperature limitations. The proposed concepts may enable a voidless contact interface of the thin film crystal layer and the semiconductor structure after transferring the thin film crystal layer, for example.

According to an aspect, the proposed methods may be used for providing a thin film crystal layer as a copper diffusion barrier. For example, the metal layer may be deposited 210 on a first electrically conductive structure. Subsequently, the metal layer on the first electrically conductive structure may be transformed into a thin film crystal layer. The method 200 may further comprise forming a second electrically conductive structure on the formed thin film crystal. For example, one of the first electrically conductive structure and the second electrically conductive structure may comprise copper atoms. By forming the thin film crystal layer between the first electrically conductive structure and the second electrically conductive structure, diffusion of copper atoms between the conductive structures may be reduced or avoided. For example, thin copper diffusion barriers may be formed in back end of line processes or temperature limited processes.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-12).

FIG. 3 shows a schematic cross section of an integrated circuit 300 with a thin film crystal layer 320. The integrated circuit 300 comprises a layer structure 310. The layer structure may be an electrically insulating layer (e.g. a $SiO_x$ layer), or a semiconductor structure. Alternatively, the layer structure 310 may be an electrically conductive structure. The layer structure may be a vertical or a lateral structure, for example. The integrated circuit 300 further comprises the thin film crystal layer 320, e.g. the thin film crystal layer 320 is located on the layer structure 310.

For example, a contact interface between the thin film crystal layer 320 and the layer structure 310 may be voidless. For example, within more than 95% (or more than 97%, or more than 99%) of an overlapping area of the thin film crystal layer 320 and the layer structure 310, the thin film crystal layer 320 may have a direct contact to the layer structure 310, e.g. a voidless contact. For example, a contact interface between the thin film crystal layer 320 and a surface of a structure adjacent to the thin film crystal layer 320 may be voidless.

The voidless contact interface between the thin film crystal layer 320 and the layer structure 310 may be achieved due to forming the thin film crystal layer 320 according to a method described above or below (e.g. according to the examples described in combination with FIG. 2).

The layer structure 310 adjacent to the thin film crystal layer 320 may be an electrically insulating structure, a dielectric structure, or an electrically conductive structure, for example. For example, other concepts including transferring thin film crystal layers onto a further structure may result in voids between the thin film crystal layer and the further structure resulting from the transfer process.

The thin film crystal layer 320 may be used in a transistor of the integrated circuit 300, e.g. a thin film crystal transistor. Accordingly, the integrated circuit 300 may further comprise a drain region, a source region, and a channel region of a transistor of the integrated circuit 300. A first portion of the thin film crystal layer 320 may be the channel region of the transistor.

For example, the thin film crystal layer 320 may comprise a transition metal dichalcogenide, a ternary MAX phase carbide material, or a ternary MAX phase nitride material. Using said materials for the channel region of the thin film crystal transistor may enable to improve a functionality of the thin film crystal transistor.

According to an example, an electrically conductive structure comprising copper may be located on the thin film crystal layer 320. For example, the layer structure 310 may be an electrically conductive structure. The layer structure may be copper-free. For example, the thin film crystal layer 320 may reduce or prevent diffusion of copper atoms from the electrically conductive structure located on the thin film crystal layer 320 into the layer structure 310 (see also examples shown in connection with FIG. 4). Due to the voidless interface of the thin film crystal layer 320 and the electrically conductive layer structure 310, a contact resistance between the electrically conductive structure comprising copper and the electrically conductive layer structure 310 may be low (e.g. due to the increased effective contact area compared to other concepts including void-containing interfaces).

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1, 2 and 3a-12).

Figure 3A:
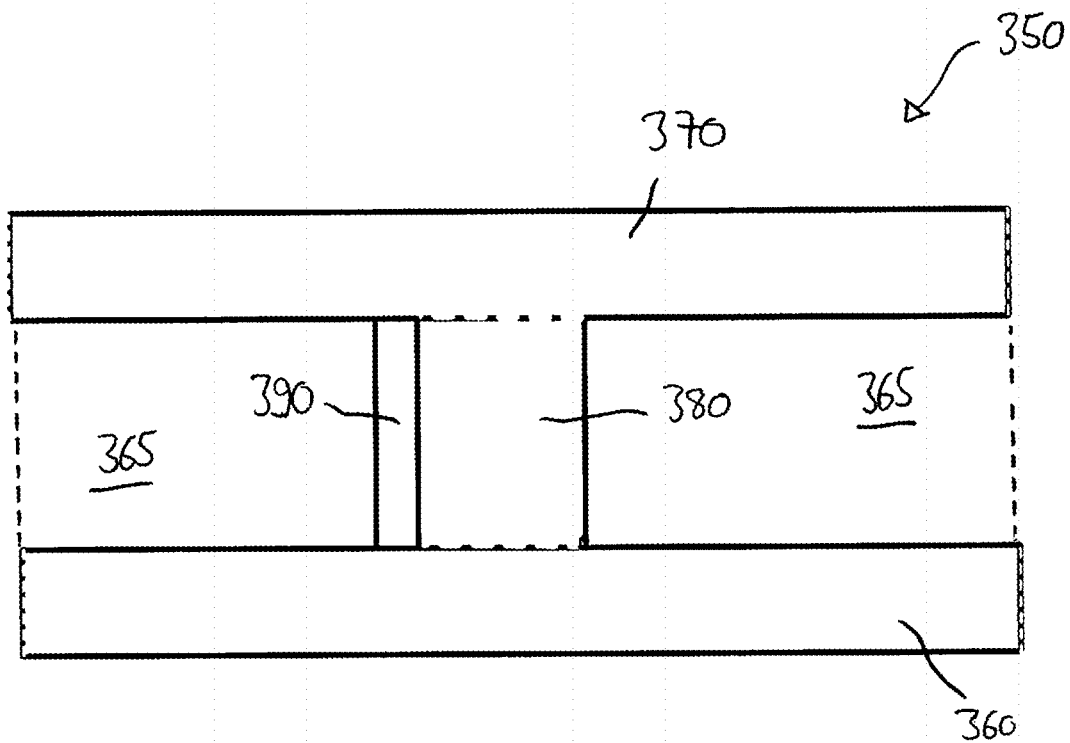
FIG. 3a shows an example of an integrated circuit with a via having a thin film crystal on a side wall of the via.

FIG. 3a shows a schematic cross section of an integrated circuit 350. The integrated circuit 350 comprises a first electrical line structure 360 in a first level of the integrated circuit 350, and a second electrical line structure 370 in a second level of the integrated circuit 350. An electrically insulating layer 365, e.g. an ILD, may be located between the first electrical line structure 360 and the second electrical line structure 370. The first electrical line structure 360 is electrically connected to the second electrical line structure 370 by a via 380 leading through the electrically insulating layer 365.

A thin film crystal layer 390 is located on at least one sidewall of the via 380. The via 380 may comprise copper, for example the via 380 may be a copper via. For example, the thin film crystal layer 390 may have a thickness (e.g. a lateral extension) of less than 10 nm. For example, the thin film crystal layer 390 may reduce diffusion of copper atoms from the via 380 to the electrically insulating layer 365. For example, the thin film crystal layer 390 may be located on all sidewalls of the via 380.

For example a thickness of the thin film crystal 390 may be smaller than 10 nm (or smaller than 5 nm, smaller than 3 nm or smaller than 2 nm). A maximum thickness of the thin film crystal 390 may be smaller than 10 nm. For example, the thin film crystal 390 may provide a minimum distance between the via 380 and the electrically insulating layer 365 of 1 nm (or at least 3 nm) and/or a maximum distance of 10 nm at a region with the thin film crystal between the via 380 and the electrically insulating layer 365. The thin film crystal 390 may comprise a plurality of two-dimensional crystalline monolayers. A two-dimensional crystalline monolayer may be a layer comprising only one layer of atoms. For example, the number of the monolayers of the thin film crystal 390 may be smaller than 20 (or smaller than 10, smaller than 8, or smaller than 5). A two-dimensional monolayer may have a thickness of less than 1 nm (or less than 0.8 nm). For example, already one or a few two-dimensional monolayers may reduce copper diffusion.

More details and aspects are mentioned in connection with the embodiments described above or below. The embodiments shown in FIG. 3a may comprise one or more optional additional features corresponding to one or more aspects mentioned in connection with the proposed concept or one or more embodiments described above or below (e.g. FIGS. 1, 2, 3 and 4-12).

Figure 4:
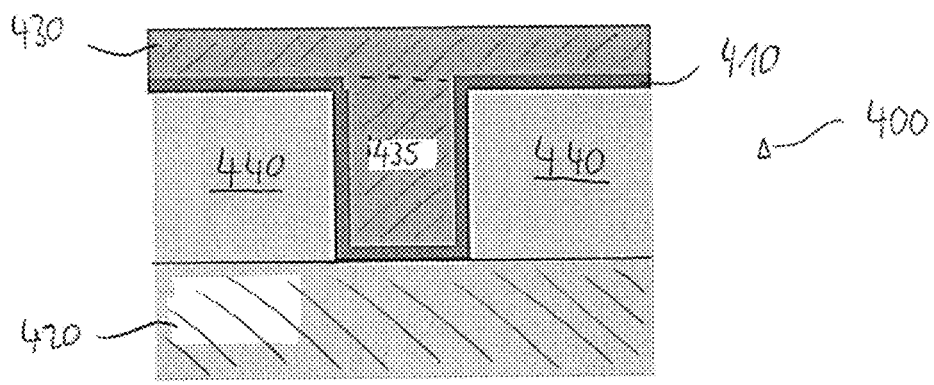
FIG. 4 shows a schematic cross section of a semiconductor device comprising a thin film crystal layer.

FIG. 4 shows a schematic side view of a semiconductor device 400 comprising a thin film crystal layer 410. The thin film crystal layer 410 forms a copper diffusion barrier, for example. The semiconductor device 400 comprises electrically conductive structures. A first electrically conductive structure 420 may comprise an electrically conductive material free of copper (or with a percentage of copper of less than 3%, less than 1%, less than 0.5%, or less than 0.1%). The electrically conductive material of the first electrically conductive structure 420 may be aluminum or an electrically conductive semiconductor material, for example. Further, the semiconductor device 400 may comprise a second electrically conductive structure 430 comprising copper. For example, the second electrically conductive structure 430 may be a copper structure with a percentage of copper of more than 80%, more than 90%, more than 95%, or more than 99%.

The first electrically conductive structure 420 may be separated from the second electrically conductive structure 430 at least partly by an electrically insulating structure 440. For example, the first electrically conductive structure 420 may be located in a first layer of the semiconductor device 400 and the second electrically conductive structure 430 may be located in a second layer of the semiconductor device 400. The two layers may be separated by the electrically insulating structure 440. For example, the electrically insulating structure 440 is a structured silicon oxide layer or an inter-layer dielectric ILD. For an electrically connection of the first electrically conductive structure 420 with the second electrically conductive structure 430, a via (vertical interconnect access) may be provided within the electrically insulating structure 440. For example, the second electrically conductive structure 440 comprises a via 435 extending vertically in direction of the first electrically conductive structure 430.

For example, the via 435 is vertically separated from the first electrically conductive structure 420 by the thin film crystal layer 410. The thin film crystal layer 410 may provide an electrical contact to enable a current path from the first electrically conductive structure 420 through the via 435 to the conductive layer of the second electrically conductive structure 430.

The thin film crystal layer 410 may reduce or even prevent migration or diffusion of copper atoms from the second electrically conductive structure 430 to the first electrically conductive structure 420. Therefore, the thin film crystal layer 410 can be described as copper diffusion barrier. For example, the thin film crystal layer 410 is vertically located between the via 435 and the first electrically conductive structure 420, and between a further region of the second electrically conductive structure 430 and the electrically insulating structure 440. For example, the thin film crystal layer 410 may also be provided laterally between the via 435 and the electrically insulating structure 440, so that migration or diffusion of copper from the second electrically conductive structure 430 into the electrically insulating structure 440 may be reduced or even prevented. For example, the copper diffusion barrier may be a single damascene or a dual damascene. Alternatively, the thin film crystal layer 410 may be provided only at side walls of the via 435, but not between the via 435 and the first electrically conductive structure 420 (bottomless feature), for example if migration of copper into the first electrically conductive structure 420 might not have an effect on a functionality of the semiconductor device 400.

For example, without providing a barrier, copper may diffuse from the copper structure into other structures of the semiconductor device, which may lead to interconnect failures, for example. Instead of using thin metals as a diffusion barrier, two-dimensional materials may be used. By using two-dimensional materials, a thickness of less than 10 nm may be sufficient for providing that copper diffusion barrier, for example. For example, the thin film crystal layer 410 may be described as two-dimensional material and may have a thickness of less than 10 nm.

Alternatively, the first electrically conductive structure 420 may be replaced by a further electrically insulating structure, and a line structure of the second electrically conductive structure 430 may be located laterally between two portions of the electrically insulating structure 440, separated from the electrically insulating structure 440 by the thin film crystal layer 410.

The thin film crystal layer 410 may comprise a two-dimensional material comprising $M_a X_b Y_c$ with $a \in [0;100]$; $b \in [0;100]$; $c \in [0;100]$. M, X, and Y may be a combination of S, Sc, Ti, V, Cr, Mn, Fe, Co, Ni, Cu, Zn, Cl, H, O, Se, Y, Zr, Nb, Mo, Tc, Ru, Rh, Pd, Ag, Cd, Te, Hf, Ta, W, Re, Os, Ir, Pt, Au, Hg, Rf, Db, Sg, Bh, Hs, Mt, Ds, Rg.

More details and aspects are mentioned in connection with the embodiments described above or below. The embodiments shown in FIG. 4 may comprise one or more optional additional features corresponding to one or more aspects mentioned in connection with the proposed concept or one or more embodiments described above or below (e.g. FIGS. 1 to 3a and 5a-12).

FIGS. 5a to 5d show an example of providing or forming a thin film crystal layer for a copper diffusion barrier. The structures in FIGS. 5a to 5d are shown in a cross-sectional side view.

Figure 5B:
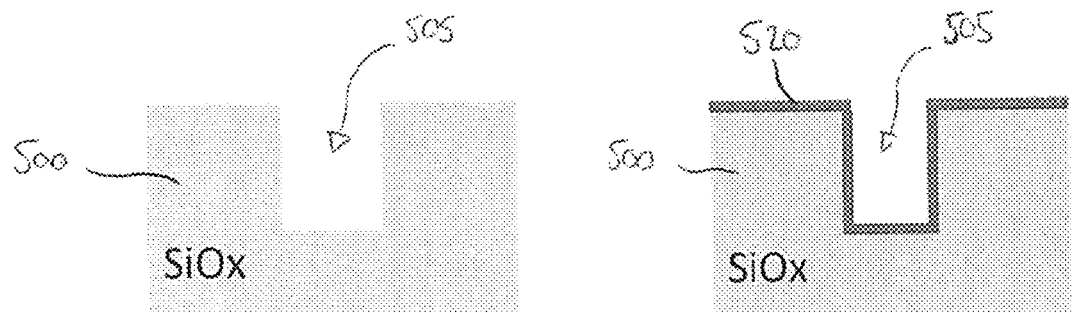
Figure 5B:
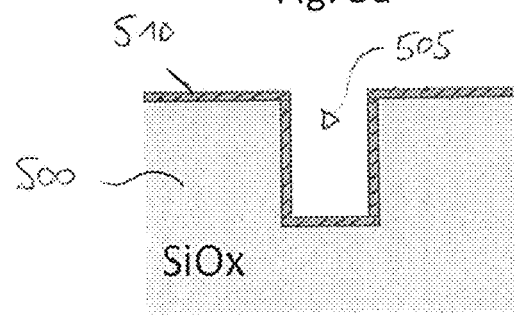
Figure 5D:
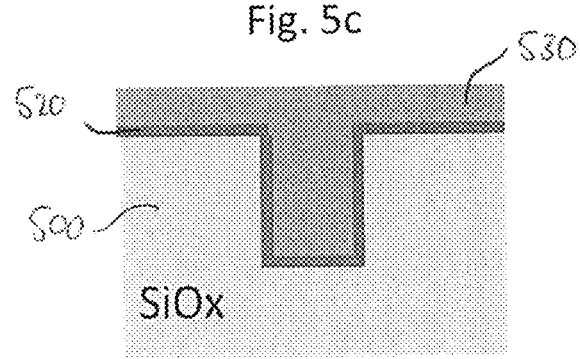

In FIG. 5a, an electrically insulating structure 500 is shown, for example a silicon oxide $SiO_x$ structure (e.g. $SiO_2$). The electrically insulating structure 500 comprises a trench 505. For example, FIG. 5a shows an incoming p-cap. For forming the thin film crystal layer, a metal layer 510 (see FIG. 5b) is deposited on the surface of the electrically insulating structure 500, comprising the surface of the trench 505 (e.g. a ground of the trench 505 and sidewalls of the trench 505). The metal layer 510 may be deposited using chemical vapor deposition CVD and may have a thickness of less than 10 nm.

Subsequently, the metal layer 510 may be transformed into a thin film crystal layer 520 (see FIG. 5c) or a transition metal dichalcogenide TMD layer by heating the metal layer 510 in a gas atmosphere, according to a method described above or below. By using said method for forming the thin film crystal layer 520, the thin film crystal layer 520 may be formed to cover a large area of the electrically insulating structure 500 within a short time. Further, a copper fill may be performed according to FIG. 5d, to form a copper structure 530. For example, the trench 505 may be completely filled with copper. Further, copper may be deposited on the semiconductor structure 500, separated (e.g. vertically separated) from the electrically insulating structure 500 by the thin film crystal layer 520.

The thin film crystal layer 520 may reduce or even prevent migration or diffusion of copper from the copper structure 530 into the electrically insulating structure 500, for example during manufacturing processes or during operation of a semiconductor device (e.g. an integrated circuit) comprising the electrically insulating structure 500. By using thin film crystal layers as diffusion barrier, thinner barriers may be provided and a line resistance may be reduced, for example.

For example, to reduce diffusion of copper, a barrier may be needed. Thin barriers may be needed to reduce a line resistance. For example, to provide a thin diffusion barrier, TaN deposited by PVD (physical vapor deposition) may be thinned down, or TaN deposited by ALD (atomic layer deposition) may be used, for example. There may be a trade-off between a thickness of the diffusion barrier and of a functionality of the barrier, for example how much it reduces diffusion of copper.

By providing a thin film crystal layer or TMD as a copper diffusion barrier, thin barriers may be provided, as two-dimensional crystals are atomically thin and may prevent copper diffusion, for example. Further, it may be possible to deposit them at a temperature compatible with back end of line BEOL processing, for example at temperatures below 400° C. This may enable forming thin film crystal layers during all times of processing a semiconductor device, for example.

An example of the present disclosure relates to thin film crystals for copper diffusion barriers.

More details and aspects are mentioned in connection with the embodiments described above or below. The embodiments shown in FIGS. 5a to 5d may comprise one or more optional additional features corresponding to one or more aspects mentioned in connection with the proposed concept or one or more embodiments described above or below (e.g. FIGS. 1 to 4 and 6a to 12).

Further examples relate to metal transformation for thin film crystals. Examples show methods for forming transistors comprising thin film crystals, and methods for forming thin film crystals comprising heterojunctions.

FIGS. 6a to 6j show an example of forming a thin film crystal layer for forming a transistor. For forming the thin film crystal layer, a thin metal layer may be deposited using chemical vapor deposition, for example. Afterwards, the metal layer may be transformed into a thin film crystal layer by heating the metal layer in a gas atmosphere. The manufacturing process shown in FIGS. 6a to 6j may be used to form an integrated circuit as shown in FIGS. 1 and 3, for example.

Figure 6A:
FIGS. 6a-6j show an example of forming a thin film crystal layer for forming a transistor.

In FIGS. 6a to 6e, structures are shown in a cross-sectional side view from a first side of view. FIG. 6a shows an example of metal patterning on an electrically insulating structure 600, for example an ILD (e.g. silicon oxide $SiO_x$ or silicon nitride). A metal layer 610 may be formed and structured on the electrically insulating structure 600. The metal layer 610 may be formed by means of chemical vapor deposition, for example. The thickness of the metal layer 610 may correspond to a thickness of a thin film crystal to be formed. The metal layer 610 may be formed with a thickness smaller than 10 nm, for example.

Figure 6B:
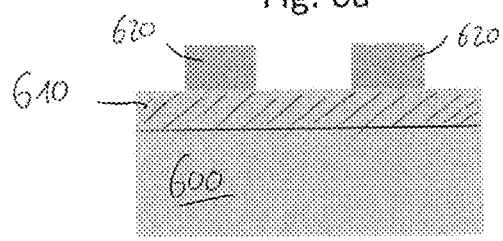
Figure 6C:
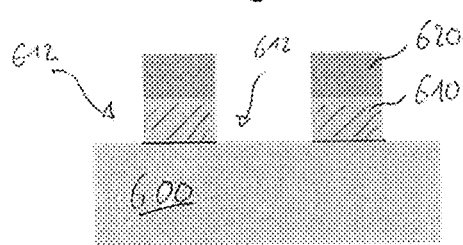
Figure 6D:
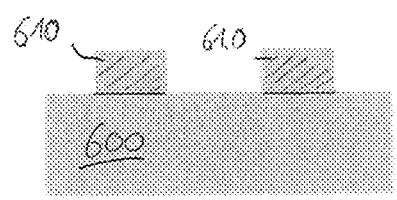

FIG. 6b shows hard mask patterning on the metal layer 610. A mask layer 620 is formed on the metal layer 610, for example. Further, a metal etch is performed to remove the metal layer 610 in regions 612 not being covered by the mask layer 620 (see FIG. 6c). Subsequently, according to FIG. 6d, the hard mask 620 is removed, for example using dry etch, wet etch, and/or ash techniques.

Figure 6E:
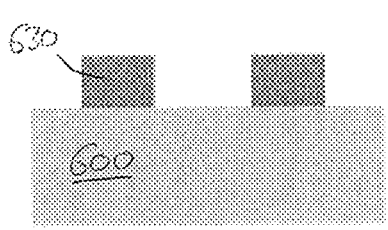

FIG. 6e shows the result of a conversion of the structured metal layer 615 into a thin film crystal or thin film crystal layer 630 using gases and heat. As described in methods above or below, the deposited metal layer may be heated in a gas atmosphere to transform the metal layer into a thin film crystal layer. For example, the metal layer may comprise molybdenum and the gas atmosphere may comprise $H_2S$ or $H_2Te$. As a result of the heating, the sulfur or tellurium of the gas atmosphere may be incorporated into the metal layer so that the metal layer transforms into a thin film crystal layer, for example a molybdenum disulfide $MoS_2$ layer or a molybdenum ditelluride $MoTe_2$ layer.

FIGS. 6f to 6j show an example of forming a thin film crystal transistor using the provided thin film crystal layer. In FIGS. 6f to 6j, structures are shown in a cross-sectional side view from a second side of view, e.g. in a 90° angle with respect to the first side of view.

Figure 6F:
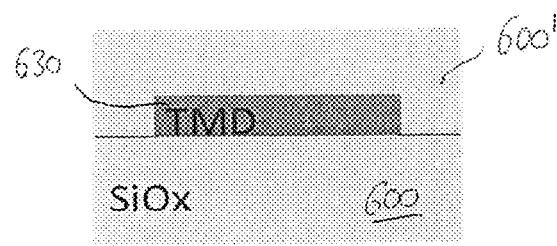

According to FIG. 6f, an ILD layer 600' is formed on the thin film crystal layer 630 so that the thin film crystal layer 630 is completely covered by insulating material, for example silicon oxide material.

Figure 6G:
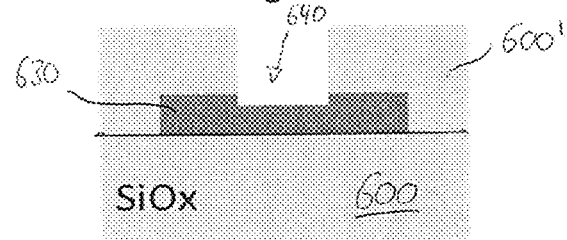

FIG. 6g shows gate patterning by forming a mask layer and structuring the ILD layer 600'. In a lateral center region of the thin film crystal layer 630, the ILD layer 600' is etched to uncover at least a top surface of the thin film crystal layer 630 so that a trench 640 is provided in the ILD layer 600'. For example, also an upper portion of the thin film crystal layer 630 may be slightly etched within the center region.

Figure 6H:
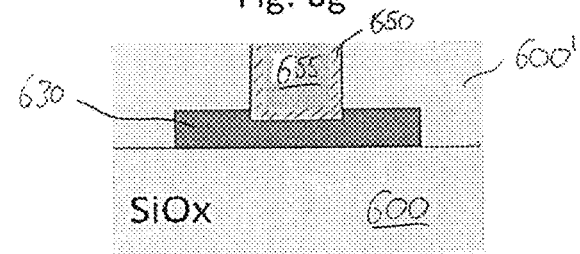
Figure 6I:
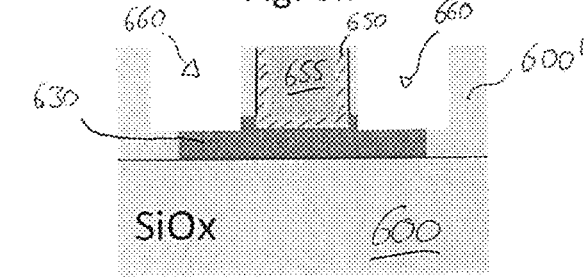

According to FIG. 6h, a gate structure of the transistor to be formed is provided. For example, a high-K dielectric material (e.g. hafnium oxide) is deposited onto the ILD layer 600' and into the trench 640 to cover the bottom and the side walls of the trench and to form a gate insulation layer 650 (e.g. a gate dielectric layer) on the thin film crystal layer 630. Further, a metal gate fill or polysilicon fill is formed in the trench to provide a gate electrode 655 on the gate insulation layer 650. Afterwards, portions of the high-K dielectric material and the metal gate fill are removed and the surface is planarized (e.g. by chemical mechanical polishing CMP).

Further, a mask layer is formed on the ILD layer 600' for etching contact openings 660 into the ILD layer 600' in two portions of the ILD layer 600' at opposite sides of the gate structure. For example, surfaces of the thin film crystal layer 630 are uncovered (see FIG. 6i), for providing a drain region and a source region of the transistor to be formed. Subsequently, according to FIG. 6j, a source and a drain structure are formed, for example by depositing metal in the contact openings and planarizing the surface. A first metal structure 670 may be a drain structure of the transistor and a second metal structure 675 may be a source structure of the transistor. Further, a top surface of the shown structure comprising the formed thin film crystal transistor may be polished to provide a flat surface of the structure above the thin film crystal 630.

Figure 6J:
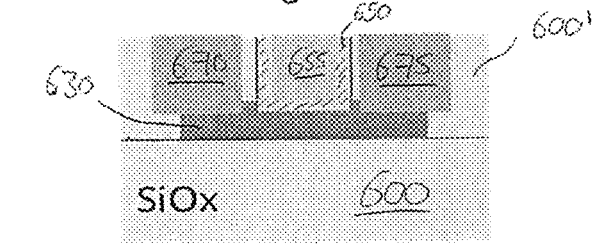

As can be seen in FIG. 6j, the formed thin film crystal layer 630 provides both a channel region, and a source/drain region of the transistor, for example. Therefore, the transistor may be referred to as thin film crystal transistor.

FIGS. 6a to 6j show a method for forming a thin film crystal comprising depositing metal and converting it, which may enable quick conversion and integration of the process, for example. For example, when using other methods for forming TMD layers including exfoliation, for example, voids may occur between the transferred TMD layers and a semiconductor structure the TMD layer is transferred to, as the transferred TMD layer may be positioned non-planar on a respective surface. By contrast, when using metal deposition and transformation into a thin film crystal, as proposed in disclosed methods, such voids may be avoided, and a voidless interface may be achieved between the thin film crystal layer and a further structure, due to the direct deposition of the metal layer, e.g. without a need of transferring a formed thin film crystal layer.

By providing proposed methods, thin film crystal integration may be achieved. Integration of forming thin film crystal during a semiconductor fabrication process may be needed as thin film crystals have a potential high-impact in semiconductor technologies, for example. However, by using other methods for forming thin film crystals, high temperatures may be needed, which may make integration in a semiconductor fabrication process impossible. Other methods may grow crystal layers by concurrently providing metal and chalcogenides in a gas atmosphere, requiring high temperatures for example. Further, according to other methods, for example thin film crystals may be provided only at random growth locations.

Using proposed methods for forming thin film crystal layers may avoid long growth times and enable control of growing locations. Fast growth of high quality materials may be achieved and can easily be integrated into technology for back end of line and front end of line processes, for example. A reproducible, scalable, fast and simple synthesis technique of high quality novel thin film crystals, for back end of line and front end of line temperatures may be provided, for example.

More details and aspects are mentioned in connection with the embodiments described above or below. The embodiments shown in FIGS. 6a to 6j may comprise one or more optional additional features corresponding to one or more aspects mentioned in connection with the proposed concept or one or more embodiments described above or below (e.g. FIGS. 1 to 5d and 7a-12).

FIGS. 7a to 7e show an example of an alternative method of forming a semiconductor structure comprising a thin film crystal layer, similar to the structure as shown in FIG. 6e. The structures are shown in a cross-sectional side view from the first side of view, for example.

Figure 7A:
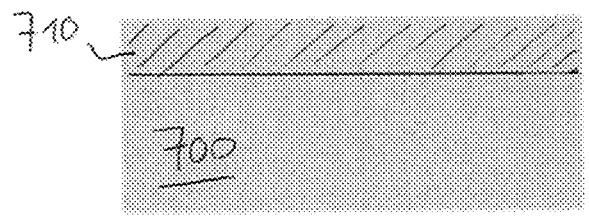
FIGS. 7a-7e show an example of forming a semiconductor structure comprising a thin film crystal layer.
Figure 7B:
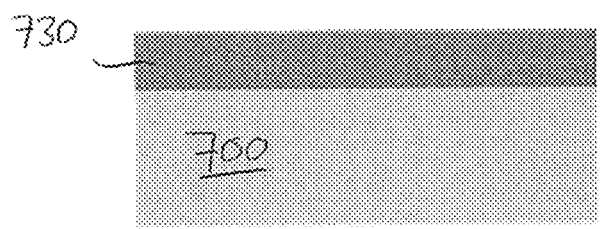

FIG. 7a shows an electrically insulating structure 700, for example an ILD layer (e.g. a silicon oxide $SiO_x$ or silicon nitride). A metal layer 710 is formed on the electrically insulating structure 700, for example by chemical vapor deposition. In a process step, the metal layer 710 may be converted to a thin film crystal by heat and gas treatment before forming structures of the layer. For example, the metal layer 710 may be treated according to a method described above or below to transform it into a thin film crystal layer 730, as shown in FIG. 7b.

Figure 7C:
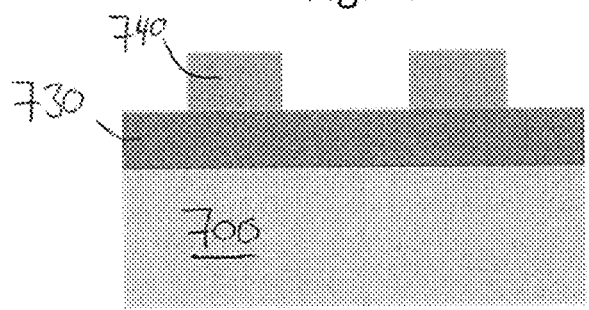
Figure 7D:
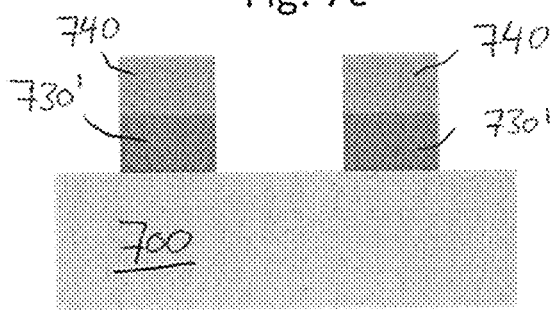

Subsequently, the formed thin film crystal layer 730 may be masked by forming a mask layer 740 and etched to provide a structured thin film crystal layer 730' (see FIGS. 7c and 7d). Further, the mask layer 740 may be removed to expose or uncover the structured thin film crystal layer 730' as shown in FIG. 7e.

Figure 7E:
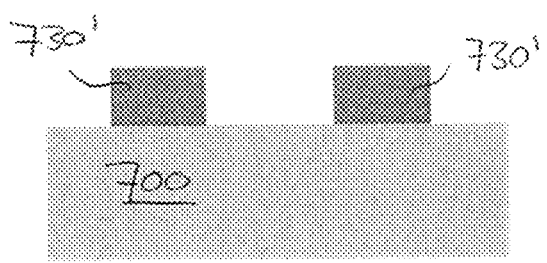

The semiconductor structure shown in FIG. 7e may be further processed similar to examples shown in FIGS. 6f to 6j to form a thin film crystal transistor using the formed thin film crystal layer 730', for example.

More details and aspects are mentioned in connection with the embodiments described above or below. The embodiments shown in FIGS. 7a to 7e may comprise one or more optional additional features corresponding to one or more aspects mentioned in connection with the proposed concept or one or more embodiments described above or below (e.g. FIGS. 1 to 6j and 8a-12).

FIGS. 8a to 10h show different examples of using proposed concepts for forming thin film crystals or thin film crystal layers comprising heterojunction structures. The structures are shown in a cross-sectional side view.

Figure 8A:
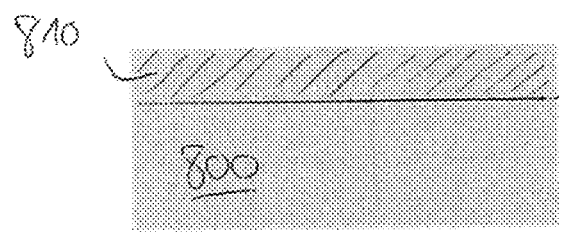
FIGS. 8a-8f show an example of forming a heterojunction crystal structure using a metal and different gases.
Figure 8D:
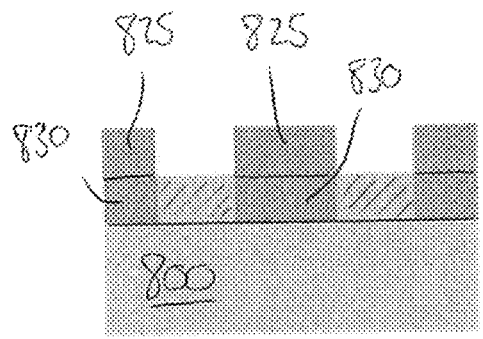
Figure 8B:
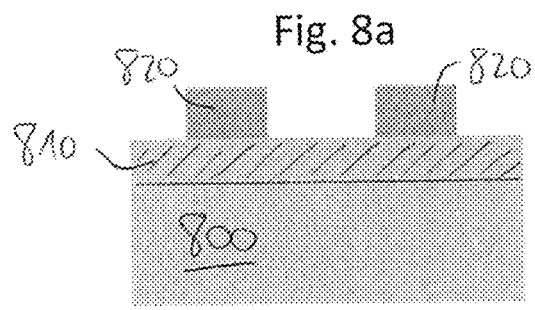

FIGS. 8a to 8f show an example of growing junctions of different crystals using a same metal but different gases for forming the thin film crystal heterojunction. Accordingly, FIG. 8a shows an electrically insulating structure 800, for example an inter-layer dielectric ILD. A metal layer 810 is formed on the ILD. A mask layer 820 is formed on the metal layer 810 to protect or cover first portions of the metal layer 810 (see FIG. 8b).

Figure 8E:
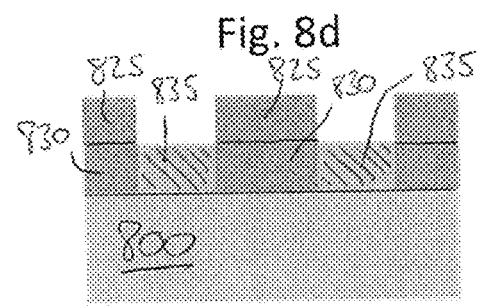
Figure 8C:
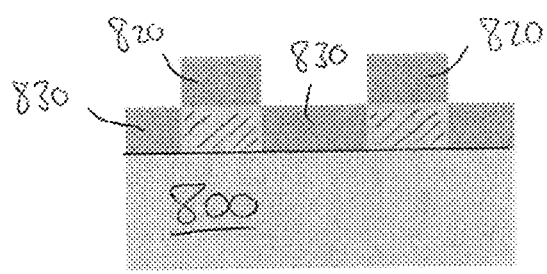
Figure 8F:
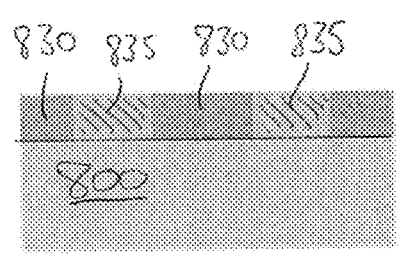

Subsequently, transformation of the metal to thin film crystal is performed by heating the shown sample up in gases. Due to the provided mask layer 820, the first portions of the metal layer covered by the mask layer remain metal, wherein second portions, uncovered by the mask layer 820 are converted or transformed into a first thin film crystal 830 due to the heating of the semiconductor structure in a first gas atmosphere, as can be seen in FIG. 8c. The type of the first thin film crystal 830 may depend on the material of the metal layer 810 and on a composition of atoms provided in the first gas atmosphere.

After transforming the first portions of the metal layer 810 into thin film crystal, the mask layer 820 may be removed and a further mask layer 825 (see FIG. 8d) is formed for covering the second portions of the partly transformed metal layer, i.e. the formed thin film crystal 830, and for exposing the remaining metal, i.e. the first portions of the former metal layer.

After forming the further mask layer 825, the structure comprising the remaining metal is heated in a second gas atmosphere, comprising atoms of a different type than atoms of the first gas atmosphere. Consequently, the second portions of the former metal layer are transformed into a second thin film crystal 835, as shown in FIG. 8e. The metal transformation of the second portions may be performed using alternate gas.

After removing the further mask layer 825 or protection layer (see FIG. 8f), a heterojunction thin film crystal layer is provided or heterojunctions are yielded on the electrically insulating structure 800. The heterojunction thin film crystal layer comprises the first thin film crystal 830 and the second thin film crystal 835, in a pattern structure with alternating portions of the thin film crystals 830, 835, for example.

According to an example, the formed heterojunction may be provided in a thin film crystal transistor. A portion of the heterojunction thin film crystal layer comprising the first thin film crystal 830 may be provided as a channel region of the transistor, and adjacent portions of the thin film crystal layer comprising the second thin film crystal 835 may be used as source and drain region, for example.

More details and aspects are mentioned in connection with the embodiments described above or below. The embodiments shown in FIGS. 8a to 8f may comprise one or more optional additional features corresponding to one or more aspects mentioned in connection with the proposed concept or one or more embodiments described above or below (e.g. FIGS. 1 to 7e and 9a-12).

FIGS. 9a to 9g show an example of growing junctions of different crystals using different metals but a same gas source.

Figure 9A:
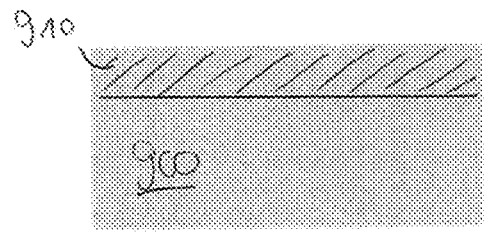
FIGS. 9a-9g show an example of forming a heterojunction crystal structure using different metals and a same gas.

Similar to the previously shown example, FIG. 9a shows an electrically insulating structure 900, for example an inter-layer dielectric ILD, with a first metal layer 910 formed (e.g. deposited) on the ILD. Metal patterning on the ILD is shown. The first metal layer 910 comprises a first metal. A mask layer 920 is formed, e.g. by hard mask patterning, to cover first portions of the first metal layer 910.

Figure 9D:
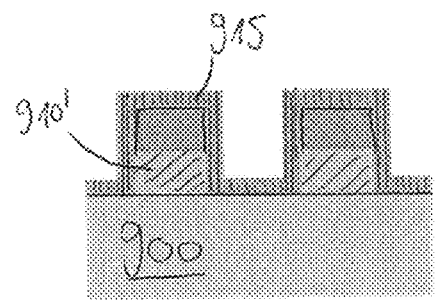
Figure 9B:
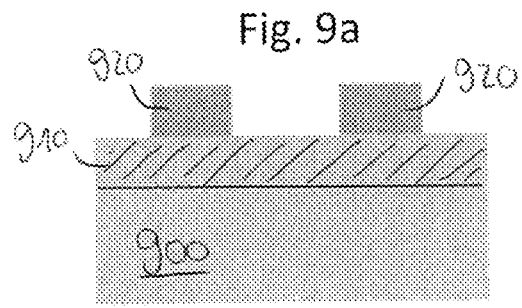
Figure 9E:
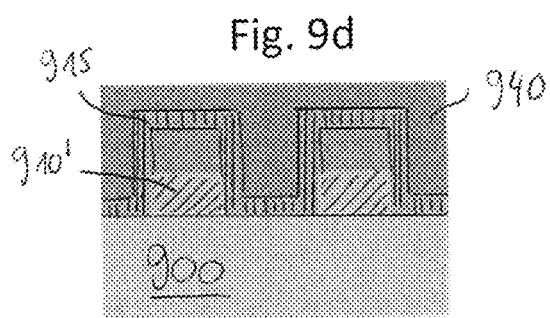
Figure 9C:
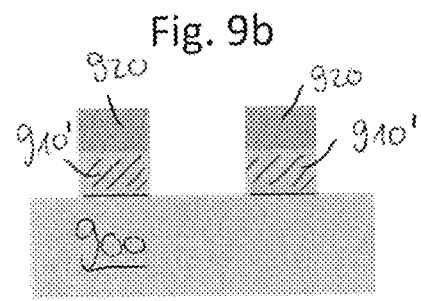
Figure 9F:
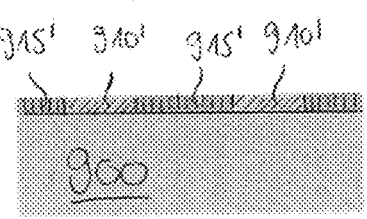

The first metal layer 910 may be etched, for example, to remove the parts of the metal layer 910 not being covered by the mask layer 920 and to form a first structured metal layer 910', as shown in FIG. 9c.

FIG. 9d shows metal deposition on the structure shown in FIG. 9c, for forming a second metal layer 915, comprising a second metal differing from the first metal of the first metal layer 910. The second metal layer 915 may have a thickness smaller than a thickness (e.g. a height) of the first metal layer 910. The second metal layer 915 may cover portions of the electrically insulating structure 900 uncovered by the first structured metal layer 910'. As a result, in a layer on the electrically insulating structure 900, a heterojunction metal layer may be formed.

As shown in FIG. 9e, a sacrificial layer 940 may be formed on the second metal layer 915. The shown structure may be planarized (e.g. by chemical mechanical polishing CMP) to remove parts of the further metal layer 915, the mask layer 920, and/or an upper vertical portion of the first structured metal layer 910', for example, together with the sacrificial layer 940. After polishing, the uncovered heterojunction metal layer on the electrically insulating structure 900 may have a thickness (e.g. a height) of less than 10 nm, for example. The formed heterojunction metal layer may comprise the first structured metal layer 910' and remaining parts of the second metal layer 915' adjacent to each other in a common layer (see FIG. 9f).

Figure 9G:
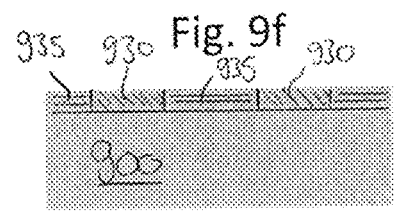

Subsequently, the heterojunction metal layer may be heated in a gas atmosphere for conversion to thin film crystals. Accordingly, FIG. 9g shows a heterojunction thin film crystal layer on the electrically insulating structure 900 comprising portions of first thin film crystal 930 next to portions of second thin film crystal 935. According to the proposed example, the heterojunction metal layer may be transformed into a heterojunction thin film crystal layer simultaneously using a common gas atmosphere. Atoms of the common gas atmosphere may cause transformation of the first metal of the structured metal layer 910' into the first thin film crystal 930, and transformation of the second metal of the second metal layer 915' into the second thin film crystal 935. The type of achieved thin film crystal may depend on the materials of the metal layers and on the composition of the gas atmosphere used for heating the heterojunction metal layer, for example.

More details and aspects are mentioned in connection with the embodiments described above or below. The embodiments shown in FIGS. 9a to 9g may comprise one or more optional additional features corresponding to one or more aspects mentioned in connection with the proposed concept or one or more embodiments described above or below (e.g. FIGS. 1 to 8f and 10a-12).

FIGS. 10a to 10h show an example of using spacers for growing thin film crystal heterojunctions. For example, some metals may expand when transforming into thin film crystal. To achieve heterojunction thin film crystal layers, e.g. without mechanical tension between portions of different crystals, spacers may be provided to separate portions of different metals in a heterojunction metal layer to be transformed into thin film crystal.

Figure 10A:
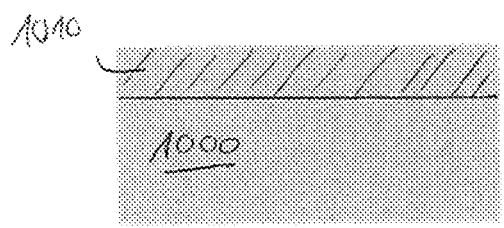
FIGS. 10a-10h show an example of forming a heterojunction crystal structure using spacers.
Figure 10B:
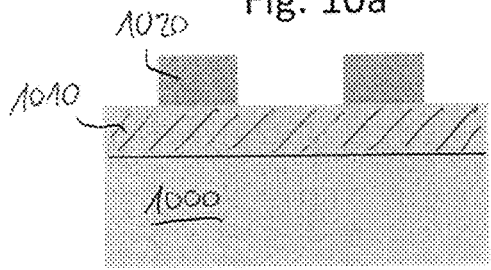
Figure 10C:
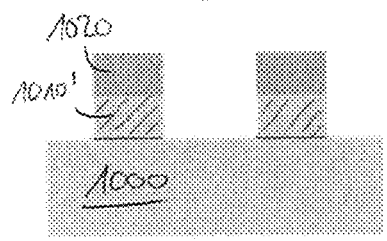

Similar to the previously shown example, FIG. 10a shows an electrically insulating structure 1000. A first metal layer 1010 is formed on the electrically insulating structure 1000. The first metal layer 1010 comprises a first metal. A mask layer 1020 is formed, e.g. by hard mask patterning, on the first metal layer 1010 for covering first portions of the metal layer, for example. Further, the first metal layer 1010 is etched, for example, to remove the parts of the metal layer 1010 not being covered by the mask layer 1020. As shown in FIG. 10c, a first structured metal layer 1010' is formed. In this way, stacks may be formed comprising portions of the first structured metal layer 1010' and the mask layer 1020.

Figure 10D:
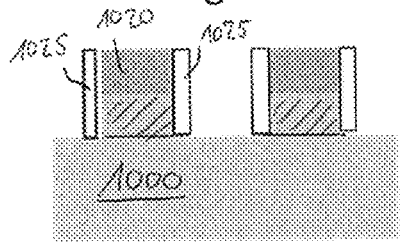
Figure 10E:
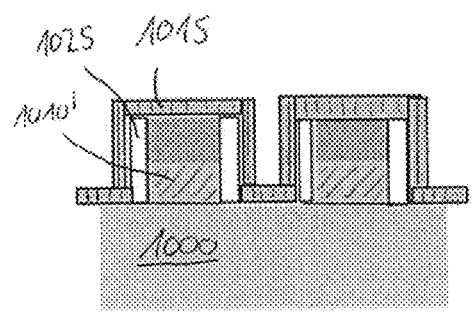
Figure 10F:
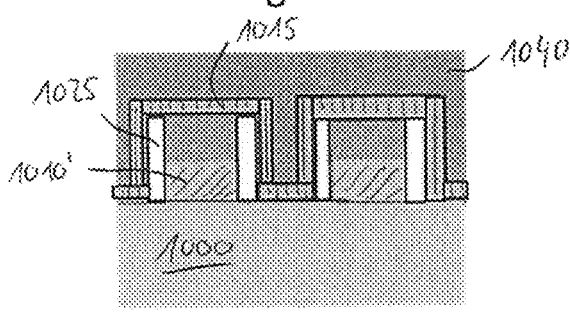
Figure 10G:
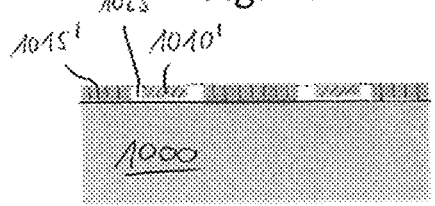

Subsequently, as shown in FIG. 10d, sacrificial spacers 1025 may be formed on sidewalls of portions of the first structured metal layer 1010' or on sidewalls of the formed stacks. Subsequently, a second metal layer 1015 may be deposited on the stacks with the adjacent sacrificial spacers 1025, as shown in FIG. 10e. The second metal layer 1015 comprises a second metal different from the first metal of the first metal layer 1010. Further, a sacrificial layer 1040 (see FIG. 10f) is formed (e.g. by sacrificial layer patterning) on the second metal layer 1015. The formed structure is polished back by polishing parts of the second metal layer 1015, parts of the sacrificial spacers 1025, the mask layer 1020, and an upper portion of the first structured metal layer 1010', for example. As a result, a thin layer comprising portions of the first structured metal layer 1010', remaining portions of the second metal layer 1015', and remaining portions of the sacrificial spacers 1025' located laterally between the first metal and the second metal may be provided, as shown in FIG. 10g.

Before transforming the metal into thin film crystal, the remaining parts of the sacrificial spacers 1025' between the portions of different metal may be removed, e.g. by etching (e.g. anisotropic etching). Consequently, free spaces located laterally between portions of the first structured metal layer 1010' and the second structured metal layer 1015' may be formed. When heating the metal portions in a gas atmosphere to transform the first metal into a first thin film crystal and the second metal into a first and a second thin film crystal (e.g. according to a method described above or below), a continuous heterojunction thin film crystal layer may be formed, as at least one of the first and second metal may laterally expand towards a proximate portion of the other metal during conversion into thin film crystal.

Figure 10H:
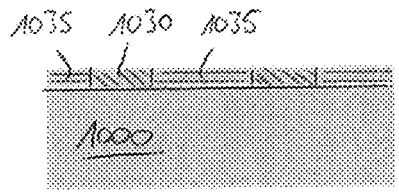

FIG. 10h shows the formed continuous heterojunction thin film crystal layer comprising first portions of a first thin film crystal 1030 adjacent to second portions of a second thin film crystal 1035.

More details and aspects are mentioned in connection with the embodiments described above or below. The embodiments shown in FIGS. 10a to 10h may comprise one or more optional additional features corresponding to one or more aspects mentioned in connection with the proposed concept or one or more embodiments described above or below (e.g. FIGS. 1 to 9g and 11a-12).

FIGS. 11a to 11d show an example of transferring a grown crystal onto a new substrate. By transferring a thin film crystal on another substrate, temperature limitations may be avoided, for example. The thin film crystal may be formed, for example using chemical vapor deposition processes, on a first substrate without temperature limitations, and may then be transferred to another substrate, for example comprising semiconductor structures and having temperature limitations.

Figure 11A:
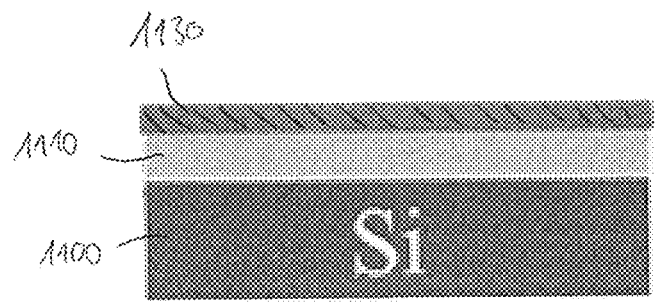
FIGS. 11a-11d show an example of transferring a grown thin film crystal onto a semiconductor substrate.
Figure 11B:
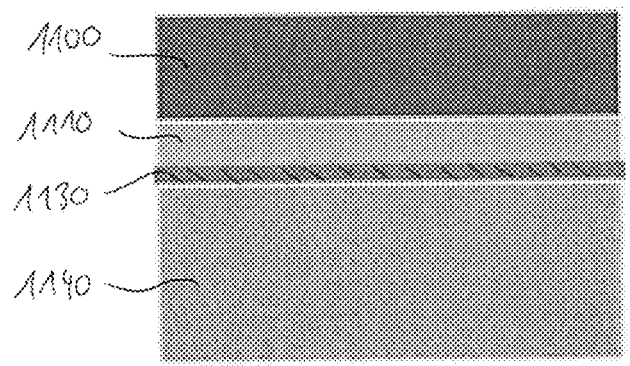

FIG. 11a shows a semiconductor substrate 1100, for example a silicon substrate. A silicon dioxide layer 1110 is grown on the semiconductor substrate 1100. Further, a thin film crystal 1130 is formed or grown on the silicon dioxide/semiconductor substrate stack, for example at high temperatures.

Subsequently, a second substrate 1140, for example an end substrate or a back end of line substrate, may be thermally annealed to the thin film crystal layer 1130, to promote adhesion of the thin film crystal to the second substrate 1140.

Figure 11C:
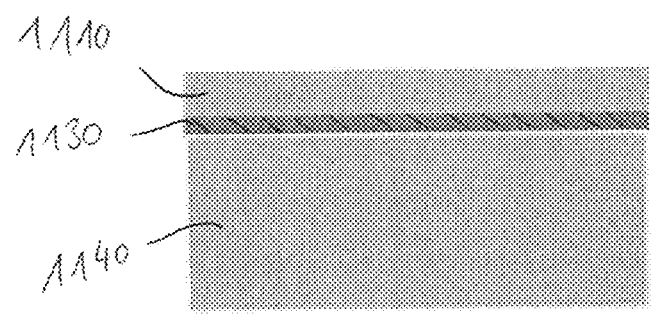
Figure 11D:
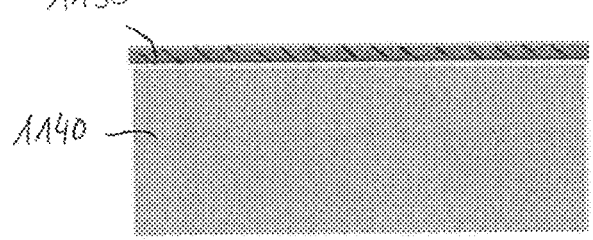

The semiconductor substrate 1100 may be grinded to remove the semiconductor substrate 1100, as is shown in FIG. 11c. Further, the silicon dioxide layer 1110 may be etched. As a result, the crystal or thin film crystal layer 1130 may be left on the back end of line substrate 1140 (see FIG. 11d). For example, the proposed method steps shown in FIGS. 11a to 11d may be repeated for providing multiple layers of thin film crystals. According to the proposed example, no temperature constraints may occur during growing the thin film crystal. Particularly, by transferring the thin film crystal using the proposed concept, it is possible that no damages of the thin film crystal layer occur during transferring it, contrary to other transferring methods, for example.

More details and aspects are mentioned in connection with the embodiments described above or below. The embodiments shown in FIGS. 11a to 11d may comprise one or more optional additional features corresponding to one or more aspects mentioned in connection with the proposed concept or one or more embodiments described above or below (e.g. FIGS. 1 to 10h or FIG. 12).

Figure 12:
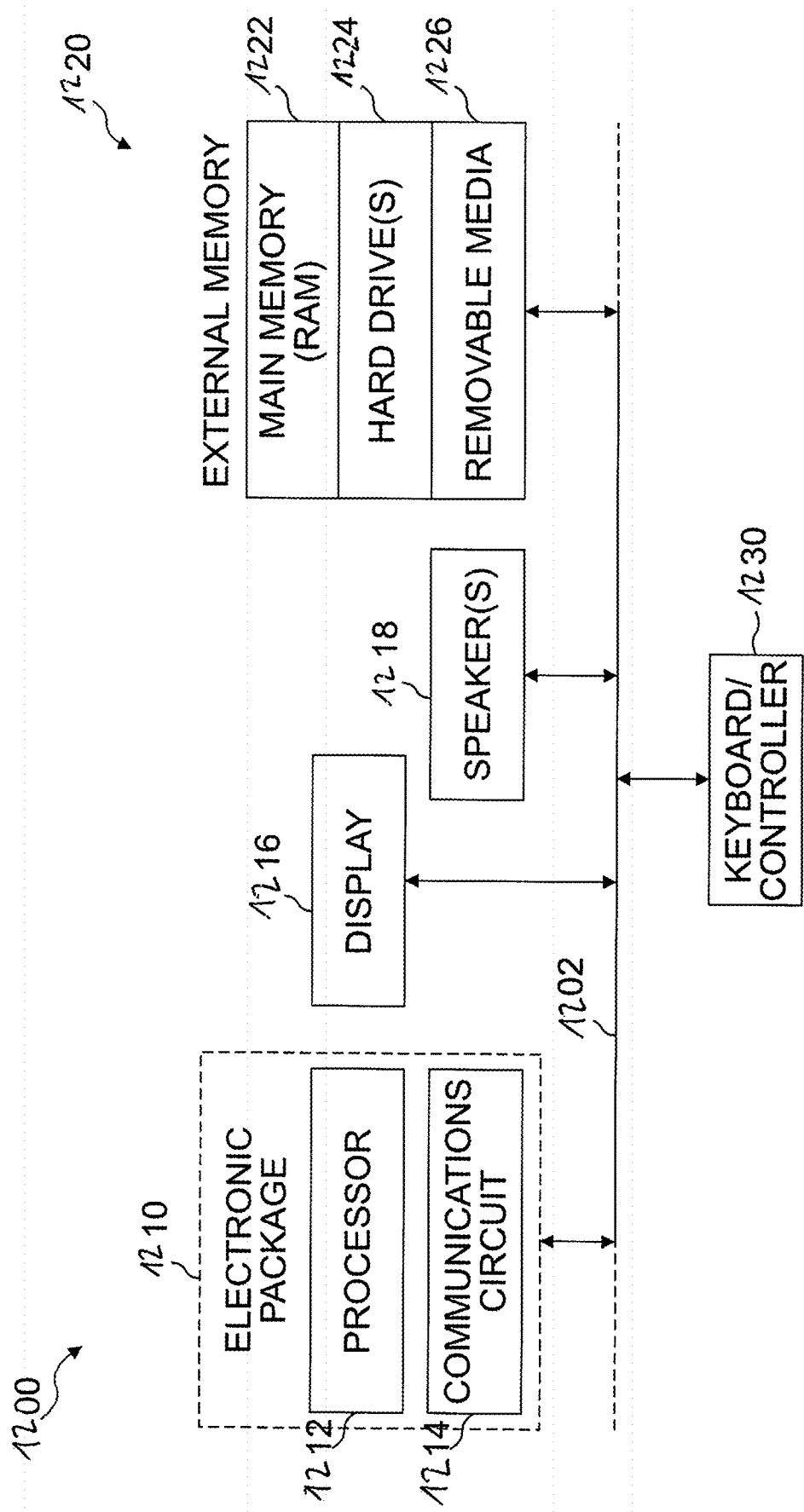
FIG. 12 shows an example of a system with an integrated circuit.

FIG. 12 is a block diagram of an electronic apparatus 1200 incorporating at least one electronic assembly, e.g. integrated circuit 100 described herein. Electronic apparatus 1200 ismerely one example of an electronic apparatus in which forms of the concepts described herein may be used.

Examples of an electronic apparatus 1200 include, but are not limited to, personal computers, tablet computers, mobile telephones, game devices, MP3 or other digital music players, etc. In this example, electronic apparatus 1200 comprises a data processing system that includes a system bus 1202 to couple the various components of the electronic apparatus 1200. System bus 1202 provides communications links among the various components of the electronic apparatus 1200 and may be implemented as a single bus, as a combination of busses, or in any other suitable manner.

An electronic assembly 1210 as describe herein may be coupled to system bus 1202. The electronic assembly 1210 may include any circuit or combination of circuits. In one embodiment, the electronic assembly 1210 includes a processor 1212 (e.g. the integrated circuit 100) which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1210 are a custom circuit, an application-specific integrated circuit (ASIC), or the like, such as, for example, one or more circuits (such as a communications circuit 1214) for use in wireless devices like mobile telephones, tablet computers, laptop computers, two-way radios, and similar electronic systems. The IC can perform any other type of function.

The electronic apparatus 1200 may also include an external memory 1220, which in turn may include one or more memory elements suitable to the particular application, such as a main memory 1222 in the form of random access memory (RAM), one or more hard drives 1224, and/or one or more drives that handle removable media 1226 such as compact disks (CD), flash memory cards, digital video disk (DVD), and the like.

The electronic apparatus 1200 may also include a display device 1216, one or more speakers 1218, and a keyboard and/or controller 1230, which can include a mouse, trackball, touch screen, voice—recognition device, or any other device that permits a system user to input information into and receive information from the electronic apparatus 1200.

Further examples relate to further aspects of the disclosure.

Example 1 relates to an integrated circuit comprising: a first electrically conductive structure; a thin film crystal layer located on the first electrically conductive structure; and a second electrically conductive structure comprising metal, wherein the second electrically conductive structure is located on the thin film crystal layer, wherein the first electrically conductive structure is electrically connected to the second electrically conductive structure through the thin film crystal layer.

Example 2 relates to the integrated circuit according to example 1, wherein the second electrically conductive structure comprises copper.

Example 3 relates to the integrated circuit according to example 1 or 2, wherein a thickness of the thin film crystal layer is smaller than 10 nm.

Example 4 relates to the integrated circuit according to example 1, 2 or 3, wherein the thin film crystal layer comprises less than 20 two-dimensional crystalline monolayers.

Example 5 relates to the integrated circuit according to one of examples 1 to 4, wherein the thin film crystal layer comprises at least 10% of metal atoms, wherein the metal atoms are Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

Example 6 relates to the integrated circuit according to one of examples 1 to 5, wherein the thin film crystal layer comprises at least 10% of secondary atoms, wherein the secondary atoms are S, Cl, H, O, Se, or Te.

Example 7 relates to the integrated circuit according to one of examples 1 to 6, wherein the thin film crystal layer comprises at least 10% of tertiary atoms, wherein the tertiary atoms are S, Cl, H, O, Se, or Te.

Example 8 relates to the integrated circuit according to one of examples 1 to 7, wherein the thin film crystal layer is a transition metal dichalcogenide TMD layer.

Example 9 relates to the integrated circuit according to one of examples 1 to 8 wherein the thin film crystal layer is embedded in back end of line portion of the integrated circuit.

Example 10 relates to the integrated circuit according to one of examples 1 to 9, wherein the second electrically conductive structure is a wiring structure of the integrated circuit.

Example 11 relates to the integrated circuit according to one of examples 1 to 10, wherein the second electrically conductive structure is electrically connected to at least one of a source region, a drain region, and a gate of a transistor of the integrated circuit.

Example 12 relates to the integrated circuit according to example 11, wherein the thin film crystal layer is located on at least a side wall of the wiring structure.

Example 13 relates to the integrated circuit according to one of examples 1 to 12, wherein a contact interface between the thin film crystal layer and a structure adjacent to the thin film crystal layer is voidless.

Example 14 relates to a method for forming a thin film crystal layer, the method comprising: depositing a metal layer, wherein the metal layer has a thickness smaller than 10 nm; and heating the deposited metal layer in a gas atmosphere for transforming the metal layer into a thin film crystal layer after depositing the metal layer.

Example 15 relates to the method according to example 14, wherein the thin film crystal layer comprises less than 20 two-dimensional crystalline monolayers.

Example 16 relates to the method according to example 14 or 15, wherein the metal layer is deposited using chemical vapor deposition.

Example 17 relates to the method according to one of examples 14 to 16, wherein the metal layer is deposited on a carrier substrate, the method further comprising: providing a substrate to a side of the thin film crystal layer opposite to the carrier substrate; and removing the carrier substrate.

Example 18 relates to the method according to example 17, wherein the metal layer is heated up to at least 500° C. before providing the substrate on the thin film crystal layer.

Example 19 relates to the method according to one of examples 14 to 16, wherein a maximum temperature during forming of the thin film crystal layer is 400° C.

Example 20 relates to the method according to one of examples 14 to 19, wherein the deposited metal layer is heated for at least 10 seconds.

Example 21 relates to the method according to one of examples 14 to 20, wherein the metal layer comprises at least one of Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

Example 22 relates to the method according to one of examples 14 to 21, wherein the gas atmosphere comprises at least one of S, Cl, H, O, Se, or Te.

Example 23 relates to the method according to one of examples 14 to 22, further comprising removing at least a portion of the metal layer, wherein the metal layer comprises a first metal; and forming a further metal layer comprising a second metal, different from the first metal, so that a layer comprising at least a first portion of the first metal and a second portion of the second metal is formed before the heating, wherein the heating in the gas atmosphere causes the first portion of the layer to transform into a first thin film crystal layer material, and the second portion of the layer to transform simultaneously into a second thin film crystal layer material.

Example 24 relates to the method according to one of examples 14 to 23, further comprising forming a mask layer on a portion of the metal layer before heating the metal layer; exposing a first portion of the metal layer uncovered by the mask layer to a first gas atmosphere during heating, to transform the metal of the first portion into a first thin film crystal layer material; removing the mask layer and forming a further mask layer on the first portion; and exposing a second portion of the metal layer uncovered by the mask layer to a second gas atmosphere during a subsequent heating, to transform the metal of the second portion into a second thin film crystal layer material.

Example 25 relates to the method according to one of examples 14 to 24, wherein the thin film crystal layer is formed during forming an integrated circuit in a back end of line process.

Example 26 relates to the method according to one of examples 14 to 25, wherein the thin film crystal layer is formed over an area of at least 0.1 $\mu m^2$, wherein a thickness of the formed thin film crystal layer within the area varies from 0.6 nm to 15 nm.

Example 27 relates to the method according to one of examples 14 to 26, further comprising structuring the metal layer to form at least two portions of a layer of different metals; forming a spacer at a side of a portion of the layer between the at least two portions, to laterally separate the at least two portions of the layer; and removing the spacer before heating the layer in the gas atmosphere.

Example 28 relates to the method according to one of examples 14 to 27, wherein the metal layer is deposited on a first electrically conductive structure, the method further comprising forming a second electrically conductive structure on the formed thin film crystal, wherein one of the first electrically conductive structure and the second electrically conductive structure comprises copper atoms.

Example 29 relates to an integrated circuit comprising: a layer arranged on a semiconductor substrate; and a thin film crystal layer located on the layer in contact with the layer, wherein a contact interface between the thin film crystal layer and the layer is voidless.

Example 30 relates to the integrated circuit according to example 29, further comprising a transistor of the integrated circuit, wherein a first portion of the thin film crystal layer is a channel region of the transistor.

Example 31 relates to the integrated circuit according to one of examples 29 or 30, wherein the thin film crystal layer comprises a transition metal dichalcogenide, a ternary MAX phase carbide material, or a ternary MAX phase nitride material.

Example 32 relates to the integrated circuit according to one of examples 29 to 31, wherein the thin film crystal layer is a heterojunction thin film crystal layer comprising at least two different thin film crystals.

Example 33 relates to the integrated circuit according to example 32, wherein the two different thin film crystals comprise different crystal materials.

Example 34 relates to an integrated circuit comprising: a first electrical line structure at a first level of a wiring layer stack of the integrated circuit; an electrically insulating layer; a second electrical line structure at a second level of the wiring layer stack of the integrated circuit; and a via leading through the electrically insulating layer, wherein the first electrical line structure is electrically connected to the second electrical line structure by the via, wherein a thin film crystal layer is located on at least one sidewall of the via.

Example 35 relates to the integrated circuit according to example 34, wherein the via comprises copper.

Example 36 relates to the integrated circuit according to example 34 or 35, wherein a thickness of the thin film crystal layer is smaller than 10 nm.

Example 37 relates to the integrated circuit according to one of examples 34 to 36, wherein the thin film crystal layer comprises less than 20 two-dimensional crystalline monolayers.

The aspects and features mentioned and described together with one or more of the previously detailed examples and FIGS., may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An integrated circuit comprising:
a first electrically conductive structure comprising a first Cu concentration;
a diffusion barrier comprising a thin film crystal layer located on the first electrically conductive structure,
wherein the thin film crystal layer is a heterojunction thin film crystal layer comprising at least two different thin film crystals;
wherein the thin film crystals comprise a transition metal dichalcogenide, a ternary MAX phase carbide, or ternary MAX phase nitride material; and
a second electrically conductive structure comprising metal,
wherein the second electrically conductive structure comprises greater than 50% copper as a second Cu concentration,
wherein the first Cu concentration is less than 20% of the second Cu concentration,
wherein the second electrically conductive structure is located on the thin film crystal layer, and
wherein the first electrically conductive structure is electrically connected to the second electrically conductive structure through the thin film crystal layer.

2. The integrated circuit according to claim 1, wherein the second electrically conductive structure comprises copper.

3. The integrated circuit according to claim 1, wherein a thickness of the thin film crystal layer is smaller than 10 nm.

4. The integrated circuit according to claim 1, wherein the thin film crystal layer comprises less than 20 two-dimensional crystalline monolayers.

5. The integrated circuit according to claim 1, wherein the thin film crystal layer comprises at least 10% of metal atoms, wherein the metal atoms are Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

6. The integrated circuit according to claim 1, wherein the thin film crystal layer comprises at least 10% of secondary atoms, wherein the secondary atoms are S, Cl, H, O, Se, or Te.

7. The integrated circuit according to claim 1, wherein the heterojunction thin film crystal layer comprises the ternary MAX phase carbide or ternary MAX phase nitride material as a first thin film crystal layer and the transition metal dichalcogenide layer as a second thin film crystal layer.

8. The integrated circuit according to claim 1, wherein the second electrically conductive structure is electrically connected to at least one of a source region, a drain region, and a gate of a transistor of the integrated circuit.

9. The integrated circuit according to claim 1, wherein a contact interface between the thin film crystal layer and a structure adjacent to the thin film crystal layer is voidless.

* * * * *